(12) United States Patent
Miller et al.

(10) Patent No.: US 11,303,269 B2
(45) Date of Patent: *Apr. 12, 2022

(54) HIGH VOLTAGE PRE-PULSING

(71) Applicant: EAGLE HARBOR TECHNOLOGIES, INC., Seattle, WA (US)

(72) Inventors: Kenneth E. Miller, Seattle, WA (US); James R. Prager, Seattle, WA (US); Ilia Slobodov, Seattle, WA (US); Julian F. Picard, Seattle, WA (US)

(73) Assignee: Eagle Harbor Technologies, Inc., Seattle, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/033,660

(22) Filed: Sep. 25, 2020

(65) Prior Publication Data

US 2021/0013874 A1 Jan. 14, 2021

Related U.S. Application Data

(63) Continuation of application No. 15/628,584, filed on Jun. 20, 2017, now Pat. No. 10,804,886.

(Continued)

(51) Int. Cl.
*H03K 3/57* (2006.01)
*H03K 17/16* (2006.01)
(Continued)

(52) U.S. Cl.
CPC ............ *H03K 3/57* (2013.01); *H02M 3/1588* (2013.01); *H02M 11/00* (2013.01); *H03K 3/36* (2013.01);
(Continued)

(58) Field of Classification Search
CPC . H02M 2001/0009; H02M 2001/0025; H02M 2001/0032; H02M 2001/0045;
(Continued)

(56) References Cited

U.S. PATENT DOCUMENTS

| 4,972,441 A | 11/1990 | Roberts et al. |
| 2006/0145678 A1 | 7/2006 | Ribeiro et al. |

(Continued)

OTHER PUBLICATIONS

International Search Report and Written Opinion in PCT Application No. PCT/US2017/038394 dated Oct. 24, 2017, 11 pages.

(Continued)

*Primary Examiner* — Diana J. Cheng

(57) ABSTRACT

Some embodiments of the invention include a pre-pulse switching system. The pre-pulsing switching system may include: a power source configured to provide a voltage greater than 100 V; a pre-pulse switch coupled with the power source and configured to provide a pre-pulse having a pulse width of $T_{pp}$; and a main switch coupled with the power source and configured to provide a main pulse such that an output pulse comprises a single pulse with negligible ringing. The pre-pulse may be provided to a load by closing the pre-pulse switch while the main switch is open. The main pulse may be provided to the load by closing the main switch after a delay $T_{delay}$ after the pre-pulse switch has been opened.

22 Claims, 15 Drawing Sheets

Related U.S. Application Data

(60) Provisional application No. 62/352,830, filed on Jun. 21, 2016.

(51) Int. Cl.

| | | |
|---|---|---|
| *H02M 11/00* | (2006.01) | |
| *H03K 3/53* | (2006.01) | |
| *H02M 3/158* | (2006.01) | |
| *H03K 3/36* | (2006.01) | |
| *H03K 17/56* | (2006.01) | |
| *H02M 3/337* | (2006.01) | |
| *H02M 3/155* | (2006.01) | |
| *H02M 1/15* | (2006.01) | |
| *H02M 1/088* | (2006.01) | |

(52) U.S. Cl.
CPC ............. *H03K 3/53* (2013.01); *H03K 17/164* (2013.01); *H03K 17/56* (2013.01); *H02M 1/088* (2013.01); *H02M 1/15* (2013.01); *H02M 3/155* (2013.01); *H02M 3/3378* (2013.01)

(58) Field of Classification Search
CPC ...... H02M 3/156; H02M 3/157; H02M 3/158; H02M 3/1584; H02M 3/1588; H02M 3/3155; H03K 17/00; H03K 17/28; H03K 17/292; H03K 17/56; H03K 5/13; H03K 5/131; H03K 5/135; H03K 5/1532; H03K 5/24; H03K 3/36; H03K 3/45; H03K 3/57
See application file for complete search history.

(56) References Cited

U.S. PATENT DOCUMENTS

| | | | |
|---|---|---|---|
| 2006/0176913 | A1 | 8/2006 | Souhaite et al. |
| 2014/0233005 | A1 | 8/2014 | Crouch et al. |
| 2015/0288335 | A1* | 10/2015 | Hoyerby ................ H03F 3/217 330/251 |
| 2017/0019015 | A1* | 1/2017 | Wibben ................ H02M 1/36 |

OTHER PUBLICATIONS

Non-Final Office Action in U.S. Appl. No. 15/628,584 dated Nov. 20, 2018, 15 pages.
International Preliminary Report on Patentability in PCT Application No. PCT/US2017/038394 dated Dec. 25, 2018, 6 pages.
Notice of Allowance in U.S. Appl. No. 15/628,584 dated May 30, 2019, 9 pages.

* cited by examiner

HIGH VOLTAGE PRE-PULSING

BACKGROUND

High voltage, nanosecond pulsing is challenging for a number of reasons. For instance, typical high voltage nanosecond pulsers have difficulty producing high voltage pulses with fast rise times and/or fast fall times. As another example, typical high voltage nanosecond pulsers have difficulty switching at high and/or variable repetition rates. As another example, typical high voltage nanosecond pulsers have difficulty producing flat top high voltage pulses. Ringing and/or overshoot are also problems for low voltage applications. These issues can arise, for example in DC-DC converters as well as other devices.

SUMMARY

Some embodiments of the invention include a pre-pulse switching system. The pre-pulsing switching system may include: a high voltage power source configured to provide a voltage greater than 1.0 kV; a pre-pulse switch coupled with the high voltage power source and configured to provide a pre-pulse having a pulse width of $T_{pp}$; and a main switch coupled with the high voltage power source and configured to provide a main pulse such that an output pulse comprises a single pulse with negligible ringing. The pre-pulse may be provided to a load by closing the pre-pulse switch while the main switch is open. The main pulse may be provided to the load by closing the main switch after a delay $T_{delay}$ after the pre-pulse switch has been opened.

In some embodiments, the pre-pulsing system includes a rectified output. In some embodiments, the pre-pulsing system includes an H-bridge switching topology. In some embodiments, either or both the main switch and the pre-pulse switch comprise a solid-state switch.

In some embodiments, the pre-pulse has a rise time less than about 5 ns, 50 ns, 500 ns. In some embodiments, the stray inductance of the pre-pulse switching system is less than about 10 nH, 100 nH, 1,000 nH. In some embodiments, the stray capacitance of the pre-pulse switching system is less than about 1 nF, 10 nF, 100 nF.

Some embodiments of the invention include a high voltage pulser. The high voltage pulser may include: a high voltage power supply; an output; a plurality of pre-pulse switches coupled with the high voltage power supply, each of the plurality of pre-pulses are configured to provide a pre-pulse to the output, wherein each of the plurality of pre-pulses have a voltage greater than 1 kV; and a plurality of main switches coupled with the high voltage power supply, each of the plurality of main switches are configured to provide a main pulse to the output with a voltage greater than 1 kV, wherein an output pulse comprises a single output pulse from the combination of the pre-pulse and the main pulse with a pulse length greater than 1 ns, 100 ns, 1 µs, 10 µs, 100 µs, 1 ms, 10 ms.

In some embodiments, the output pulse may have negligible ringing. In some embodiments, each of the main pulses are provided after a delay from the plurality of pre-pulse switches providing the plurality of pre-pulses.

In some embodiments, the plurality of pre-pulse switches and the plurality of main switches are arranged in an H-bridge topology. In some embodiments, the pre-pulse has a rise time less than about 50 ns. In some embodiments, the high voltage pulser may include a rectified output.

Some embodiments include a high voltage pre-pulse switching calibration method comprising: providing a high voltage pre-pulse with a pulse width $T_{pp}$ to a load; providing a high voltage main pulse to the load after a delay $T_{delay}$, the delay $T_{delay}$ is shorter than the pulse length of the pre-pulse $T_{pp}$, and the high voltage main pulse has an output voltage $V_{out}$; adjusting the pulse width of the pre-pulse $T_{pp}$; and adjusting the delay $T_{delay}$ until the pre-pulse and the main pulse merge into a single pulse at the load.

In some embodiments, the pulse width $T_{pp}$ is less than 10 ns, 100 ns, 1,000 ns. In some embodiments, the delay $T_{delay}$ is less than 1 ns, 10 ns, 100 ns.

In some embodiments, adjusting the delay $T_{delay}$ until the pre-pulse and the main pulse merge into a single pulse at the load further comprising incrementing the delay $T_{delay}$ by a factor of $T_{delay}/100$.

In some embodiments, adjusting the pulse width of the pre-pulse $T_{pp}$, further comprises: determining that the voltage at the load from the pre-pulse is less than the output voltage; and increasing the pulse width of the pre-pulse $T_{PP}$.

In some embodiments, adjusting the pulse width of the pre-pulse $T_{pp}$, further comprises: determining that the voltage at the load from the pre-pulse is substantially equal to the output voltage, and the width of the main pulse is greater than 1 ns, 100 ns, 1 µs, 10 µs, 100 µs, 1 ms, 10 ms, 100 ms, 1 s, etc.; and decreasing the pulse width of the pre-pulse $T_{pp}$. In some embodiments, the width of the main pulse can be any length.

In some embodiments, the delay $T_{delay}$ is less than the pulse width of $T_{pp}$. In some embodiments, the output voltage $V_{out}$ is greater than 1.0 kV. In some embodiments, the pre-pulse has a rise time less than about 50 ns.

These illustrative embodiments are mentioned not to limit or define the disclosure, but to provide examples to aid understanding thereof. Additional embodiments are discussed in the Detailed Description, and further description is provided there. Advantages offered by one or more of the various embodiments may be further understood by examining this specification or by practicing one or more embodiments presented.

BRIEF DESCRIPTION OF THE FIGURES

These and other features, aspects, and advantages of the present disclosure are better understood when the following Detailed Description is read with reference to the accompanying drawings.

DETAILED DESCRIPTION

Systems and methods are disclosed to provide high voltage switching that generates clean square waveforms at a load with negligible ringing and/or overshoots at switching transitions. These systems and methods include pre-pulsing techniques that can mitigate ringing and/or voltage and current overshoots that can be caused by stray inductance and/or stray capacitance, and/or the interaction between the two, in a switching circuit. Further, these individual clean square pulses can then be combined to form longer square pulse outputs of up to DC duration. In some embodiments, a continuous applied current may be applied to the load. In some embodiments, square pulses can be combined to create two or more chains of pulses with variable or set pulse widths and/or the pulses are repeated at a set repetition frequency.

While some embodiments of the invention are described in conjunction with high voltage pulsing applications, embodiments are not limited to high voltage applications or pulsing applications. Indeed, in addition to high voltage applications (e.g., greater than 1 kV) some embodiments can extend to applications with voltages as low as 10 volts or 100 volts or 500 volts. In addition, some embodiments may extend to non-pulsing applications such as, for example, DC-DC converters, AC-DC converters, computers, electric cars, motor drives, inverters, solar power inverters, wind power inverters, etc.

Ringing can include oscillations of a pulsed signal that may dissipate after step response. In some cases, ringing may have a dissipation time that is greater than the length of the pulse. FIG. 2B is an example, of a square wave pulse with ringing. Ringing can be defined by the frequency of the oscillations, the overshoot voltage (e.g., the maximum voltage overshoot measured relative to the flat top voltage), and/or the dissipation time (e.g., the amount of time for the ringing to dissipate). It may be impossible to completely eliminate ringing, but it can be significantly reduced. Negligible ringing, for example, may include ringing that has an overshoot voltage less than about 1%, 5%, 10%, or 20% of the flattop voltage of the pulse.

Figure 1:
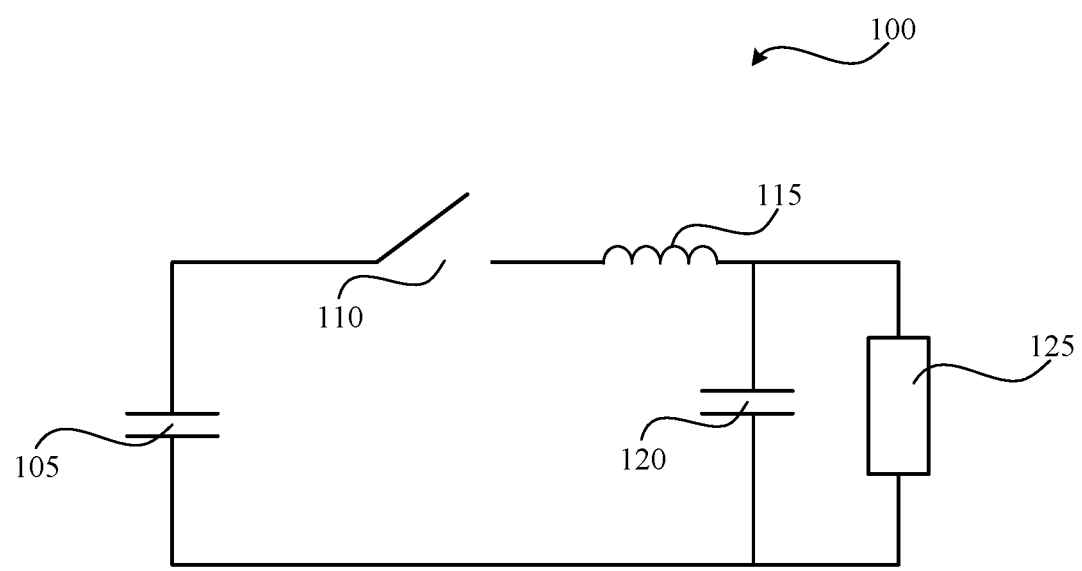
FIG. 1 is a block diagram of a switching circuit according to some embodiments.

FIG. 1 is a block diagram of a switching circuit 100. The switching circuit 100 includes a storage capacitor 105 (or high voltage power supply, or a battery), a switch 110, stray inductance 115, stray capacitance 120, and a load 125. The storage capacitor 105, for example, may represent any type of device that can store and release high voltage pulses when the switch 110 is closed. In addition, the storage capacitor 105 may include capacitance associated with any device that is used to store and release high voltage pulses when the switch 110 is closed. Any input voltage may be read across the storage capacitor 105. In some embodiments, the switch 110, including any other switch described in this document, may include any type of solid state switch such as, for example, IGBT, MOSFET, FETs, SiC, GAN, etc. switches.

The stray inductance 115 represents any inductance found within the switching circuit 100 including inductance associated with the switch 110. This may include inductance associated with any transformers, connections to the load 125, inductance within the load 115, and inductance in any other circuit elements. The stray capacitance 120 represents any capacitance found within the switching circuit 100 including capacitance associated with the switch 110. This includes capacitance associated with any transformers, connections to the load 125, capacitances within the load 115, and capacitance in any other circuit elements.

The load 125 may represent any type of load across which output voltage may be read and/or recorded. In some embodiments, the load may be resistive, capacitive, inductive, or any combination thereof. In some embodiments, an output voltage may be read across the stray capacitance 120.

Figure 2A:
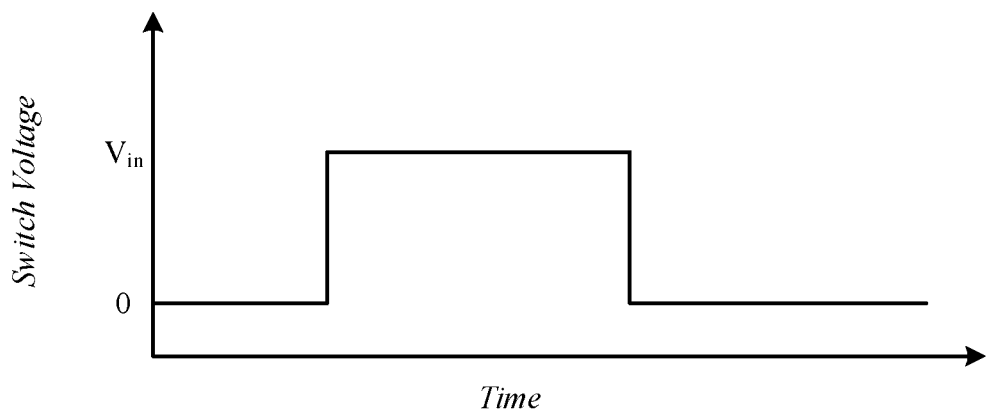
FIG. 2A illustrates a square pulse, switch voltage.
Figure 2B:
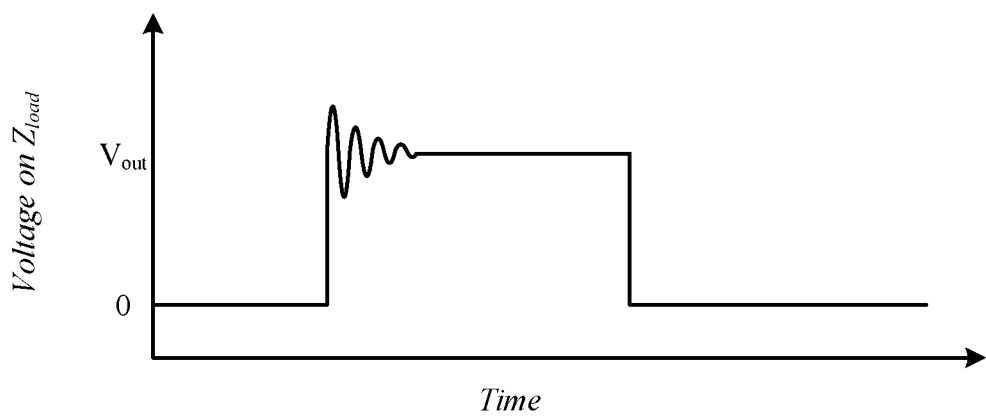
FIG. 2B illustrates a square pulse, load voltage resulting from the square pulse, switch voltage shown in FIG. 2A.

FIG. 2A illustrates switch voltage over time taking the form of a square pulse. The switch voltage, for example, may be a measure of the voltage between the switch 110 and all or part of the stray inductance 115. The square pulse may, for example, be generated by the storage capacitor 105 as a result of closing and opening of the switch 110. The square pulse, for example, may have a voltage greater than 100 V, 1 kV, 10 kV, or 100 kV and rise times of about 1-50 ns, 1-200 ns, or 1-10,000 ns.

FIG. 2B illustrates load voltage over time. As shown, the load voltage is a square pulse with a ringing feature where the voltage level over and under shoots the flat top output voltage $V_{out}$ for a period of time until a steady state flat top output voltage $V_{out}$ is achieved. The ringing may occur, for example, at the beginning of the square pulse and/or at the turn on portion of the square pulse. The amplitude of the ringing may be as much as triple the flat top output voltage $V_{out}$. The ringing may exhibit just an overshoot or just an undershoot, or any combination of undershoots and/or overshoots. In general, the ringing will decay away after some period that may be significantly less than or greater than the duration of the underlying pulse. This ringing can, for example, cause damage to the load or switching circuitry.

Ringing, for example, may result from the interaction between "stray" (or "parasitic") reactive circuit elements in the switching circuit. FIG. 1 is a block diagram of a switching circuit 100 showing the stray capacitance 120 and the stray inductance 115 represented as circuit components. Assuming, for example, the stray inductance 115 and the stray capacitance 120 are small (e.g., stray inductance, $L_s$, is less than about 1 nH, and/or the stray capacitance, $C_s$, may be less than about 1 pF, 10 pF, 100 pF), the intended behavior is as follows: When the switch 110 is closed the voltage on the storage capacitor 105 (e.g., the flat top output voltage $V_{out}$) is applied to the load 125. The load 125 may have an impedance $Z_{load}$. The current, found from $V_{charge}/Z_{load}$, flows through the switch 110 (e.g., when dI/dt=0). The switch 110 may open, at which point the voltage on the load 125 may return to zero. In some embodiments, the stray capacitance, $C_S$, and/or the stray inductance, $L_S$, may be negligible in comparison with other circuit elements. In some, but not all situations, the value of the storage capacitor 105 may be generally large enough to maintain a nominally constant voltage on the load 125 while the switch 110 is closed. The storage capacitor 105 may equivalently be a storage battery 105, or any other equivalent voltage source that maintains a relatively constant voltage during the operation of switch 110.

In some embodiments, $L_s$ and/or $C_s$ may be considered to be small and/or negligible when their presence does not meaningfully alter the desired behavior of the circuit. For example, this may occur when the quantity $(L_sC_s)^{0.5}$ is small compared to the switch transition time. The switch transition time may, for example, include the time it takes for the switch to transition from on to off, or off to on, or equivalently from conducting to non-conducting, or non-conducting to conducting. For example, small might be 1% or 10% or 100% of the switch transition time. In some embodiments, $(L_sC_s)^{0.5}$ may be approximately the quarter cycle ring time of $L_s$ and $C_s$.

Ringing may begin to arise when stray inductance 115 and stray capacitance 120 become non-negligible relative to the switching speed, such as, for example, in ranges of 1 nH to 10 pH and 1 pF to 1 μF, respectively. As current starts to flow through stray inductance 115, magnetic energy is stored inductively. The current passing through the stray inductance 115 continues to rise until the voltage on the stray capacitance 120 reaches the voltage on the storage capacitor 105, when the current reaches its maximum level, which may, for example, be greater than $V_{charge}/Z_{load}$. The inductance of the stray inductance 115 maintains current-flow in the forward direction, overcharging the stray capacitance 120 to a value greater than the flat top output voltage $V_{out}$ that would otherwise be applied directly to the load were the stray capacitance and inductance negligible. Depending on various parameters of the circuit, ringing may continue for multiple cycles as seen in FIG. 2 and/or may be quickly damped to flat top output voltage $V_{out}$ after the initial voltage overshoot.

In some embodiments, $L_s$ and $C_s$ may be considered non-negligible when their presence alters the circuit performance in a measurable or important way. For example, this may occur when the quantity $(L_sC_s)^{0.5}$ is large compared to the switch transition time. The switch transition time may, for example, include the time it takes for the switch to transition from on to off, or off to on, or equivalently from conducting to non-conducting, or non-conducting to conducting. For example, large might be 1, 10, or 100 times the switch transition time. In some embodiments, $(L_sC_s)^{0.5}$ may be approximately the quarter cycle ring time of $L_s$ and $C_s$.

The stray inductance 115 and/or the stray capacitance 120 are not intentional circuit elements. Instead, the stray inductance 115 and/or the stray capacitance 120 are generally distributed throughout the switching circuit 100 and/or may result from the physical geometry of the output traces, wires, and/or other components through which magnetic and electric energy may be stored or flow when the circuit is operated.

The ringing may be a result of the underdamped interaction between the stray capacitance 120 and the stray inductance 115. These elements have a natural ringing frequency, with a quarter period T/4. During switching timescales (the time it takes the switch to transition from open to closed), the switch may act as a resistive damping element and can mitigate ringing during its transition. However, as switching timescales approach or fall below the quarter period T/4, the switch is no longer resistive on the timescale of the ringing. When striving for fast rise times, generally on the order of 1,000 ns or less, the ringing may be worse than with slower rise times because the switches transition faster and there is less of a damping effect created by the switch. Further, once the switch has closed, there is minimal additional damping, and the stray inductance and capacitance are free to interact and ring. In addition, while the resistive damping of the switch can be considered a loss channel, the resulting ringing of a fast switch may also be considered an electrical loss. Some embodiments may improve the efficiency of a switching system by mitigating at least some or all of these types of switching losses.

In some embodiments, a short pre-pulse may be provided to a load prior to the main pulse by quickly closing the switch 110. This short pre-pulse may, for example, reduce or eliminate any ringing. In some embodiments, the pre-pulse may have a pulse width $t_{pp}$. In some embodiments, there may be a delay between the pre-pulse and the main pulse of $t_{delay}$. In some embodiments, the length of $t_{pp}$ and $t_{delay}$ may vary depending on the load 125, the stray capacitance 120, the stray inductance 115, and/or the flat top output voltage $V_{out}$. In some embodiments, the length of $t_{pp}$ and/or $t_{delay}$ may have a length less than about 1,000 ns. For example, $t_{pp}$ may have pulse width of 1 ns, 10 ns, 50 ns, 100 ns, 200 ns, 500 ns, 1,000 ns, etc. For example, $t_{delay}$ may be a delay of 0.1 ns, 1 ns, 10 ns, 50 ns, 100 ns, 200 ns, 500 ns, 1,000 ns, etc. In some embodiments, $t_{delay}$ may be less than $t_{pp}$.

In some embodiments, the pre-pulse switch may remain open after the main switch is closed. In this embodiment, $T_{delay}$ may be longer than $T_{pp}$ and/or may be as long or nearly as long as the pulse width of the main pulse.

In some embodiments, a pre-pulse may be produced that provides a short initial pulse to inject only enough charge from the storage capacitor 105 to charge the stray capacitance 120 (through the stray inductance 115) to the flat top output voltage $V_{out}$, and, for example, not higher. This total amount of energy is ½ $C_{stray}*V_{out}^2$, or a total charge of $Q=C_{stray}*V_{out}$, in addition to any current flowing through $Z_{load}$. The switch is closed for a time $t_{pp}$, usually on the order, for example, of 10-1,000 ns, and then reopened. During this time, the output voltage rises to the flat top output voltage $V_{out}$. The switch is held open for an appropriate time $t_{delay}$, for example, between 1 ns and 100 ns, and then the switch is closed again. The output that results is a pulse with greatly reduced overshoot and/or ringing and variable pulse width. Typical reductions in the overshoot and ringing would be greater than a factor of 2, and in some instances greater than a factor of 200. By charging stray capacitance 120 to the correct voltage with the initial pulse, when the switch is closed a second time, current does not need to flow to charge stray capacitance 120, which already sits at the flat top output voltage $V_{out}$. This eliminates the problem of the extra stored magnetic energy in the stray inductance 115 because when the switch is reclosed, the current flowing through the stray inductance 115 is identically $V_{out}/Z_{load}$, the steady-state value. The pre-pulse accomplishes two main things: injecting enough energy to only just charge stray capacitance 120 to the correct voltage, and ensure that the current through the stray inductance 115 is $V_{out}/Z_{load}$ when the switch re-closes. In some embodiments, the duration and delay settings of the pre-pulse may be set to accomplish these two items.

Figure 3:
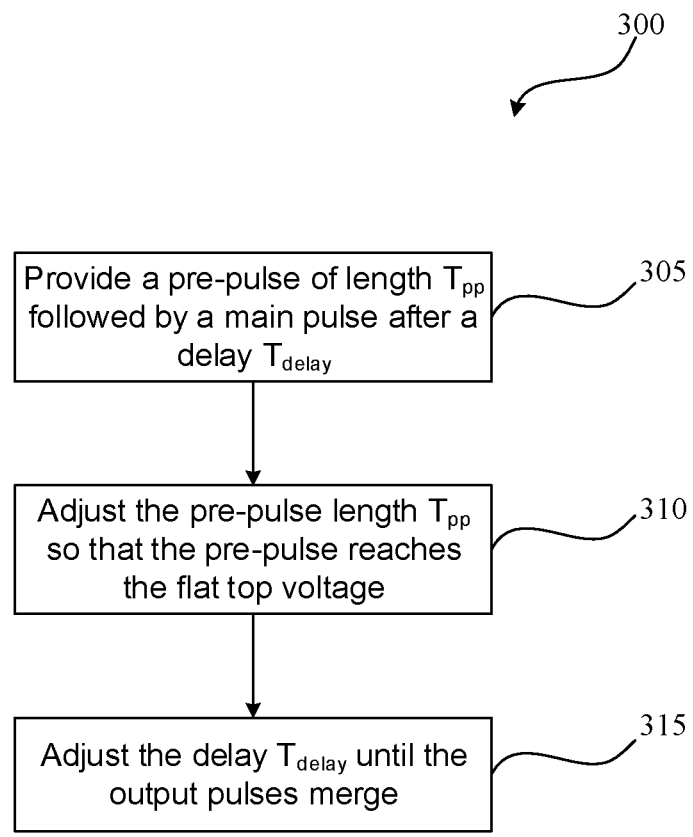
FIG. 3 is a flowchart of a process for calibrating a pre-pulse system according to some embodiments.
Figure 15:
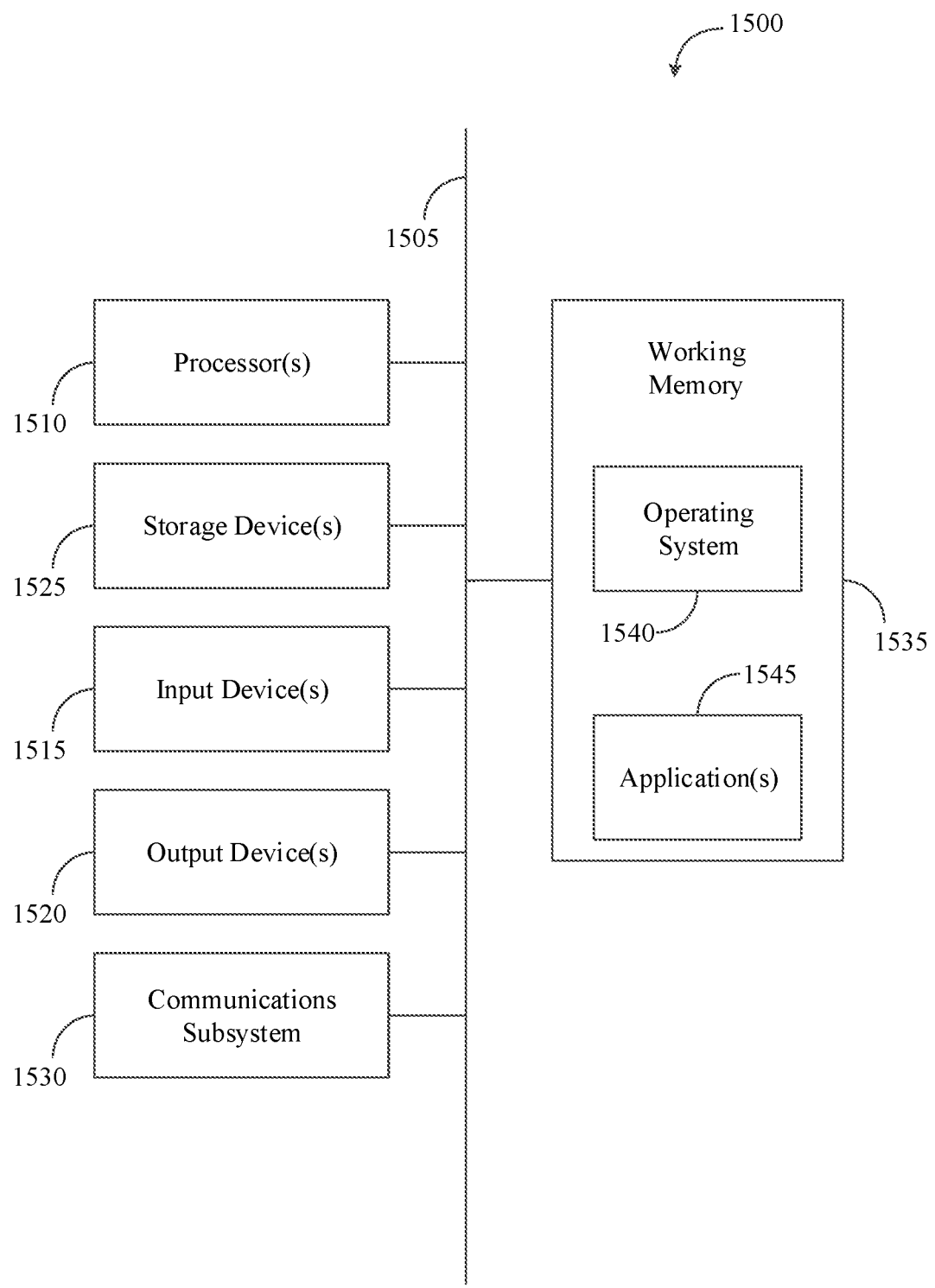
FIG. 15 shows an illustrative computational system for performing functionality to facilitate implementation of embodiments described herein.

FIG. 3 is a flowchart of a process 300 for calibrating a pre-pulse system. Although illustrated as discrete blocks, various blocks may be divided into additional blocks, combined into fewer blocks, or eliminated, depending on the desired implementation. In some embodiments, the process 300 may be controlled by any processor or controller such as, for example, computational unit 1500 shown in FIG. 15. In some embodiments, the input devices of the computational unit 1500 may include one or more voltage or current sensors.

Figure 4A:
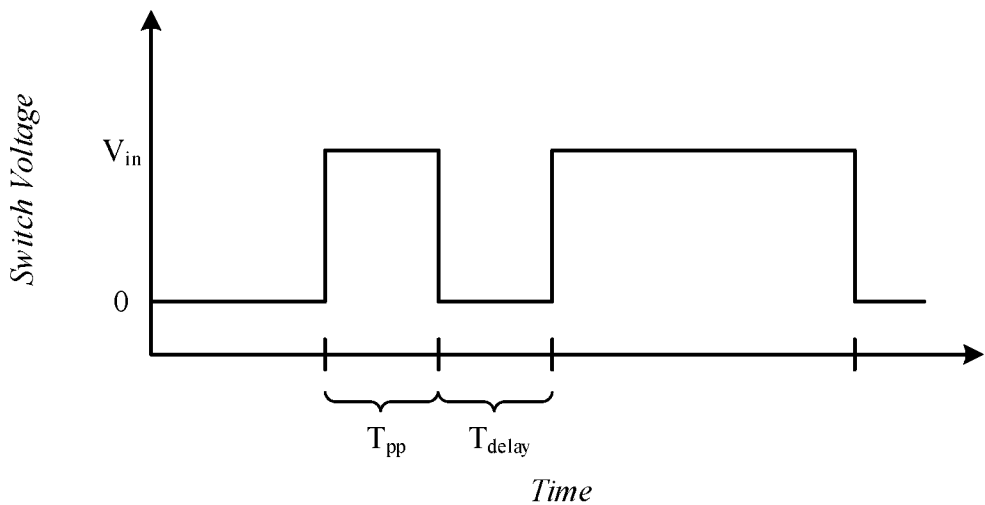
FIG. 4A illustrates a square pulse, switch voltage.
Figure 4B:
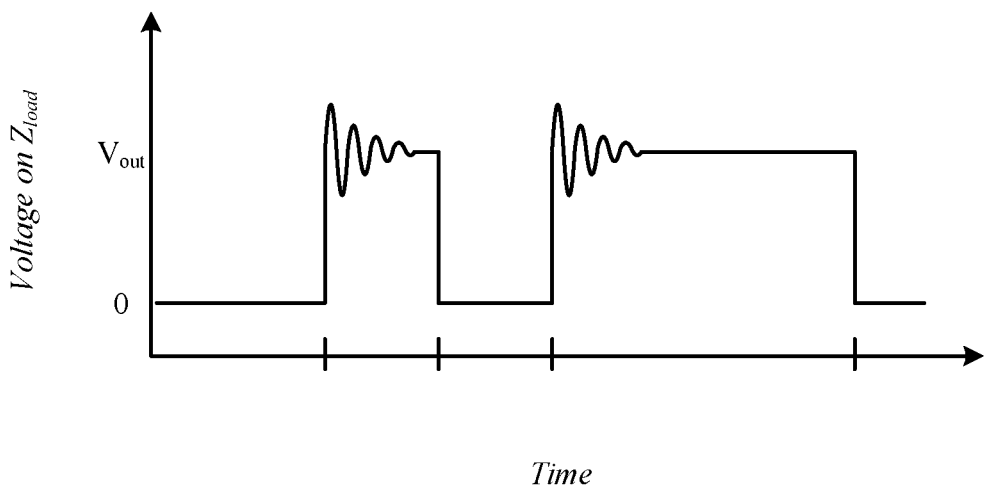
FIG. 4B illustrates a square pulse, load voltage resulting from the square pulse, switch voltage shown in FIG. 4A.

The process 300 starts at block 305, where a pre-pulse of length $T_{pp}$ may be followed by a main pulse after a delay $T_{delay}$. FIG. 4A shows an example pre-pulse and main pulse at a point between the switch 110 and the stray inductance 115. FIG. 4B shows the result output pulse at the load 125. As shown in FIG. 4B, at block 305 $T_{pp}$ may be set, for example, such that ringing and/or voltage overshoot may clearly be seen on the output pulse corresponding with the pre-pulse. In addition, the $T_{delay}$ may be set, for example, so that the main pulse is clearly separated from the pulse in the output waveform.

Figure 5A:
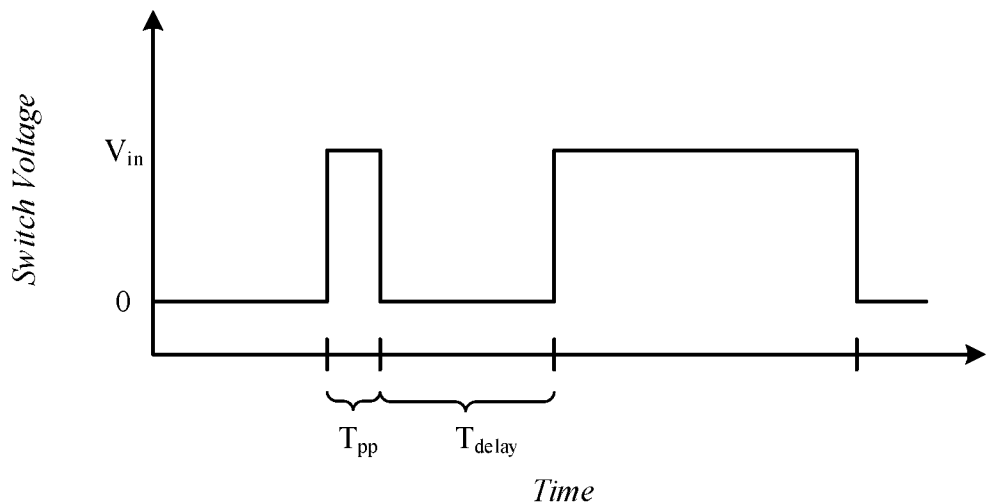
FIG. 5A illustrates a square pulse, switch voltage during a second calibration step.
Figure 5B:
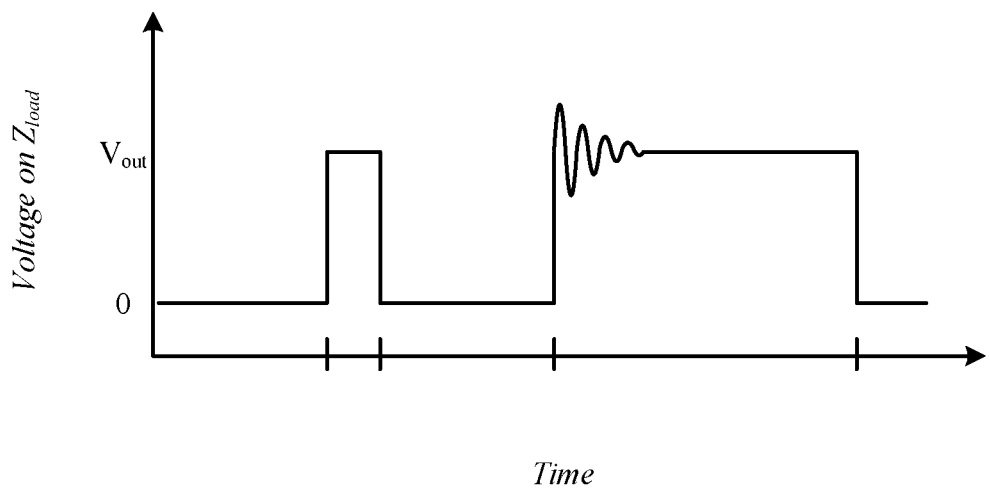
FIG. 5B illustrates a load voltage resulting from the square pulse, switch voltage shown in FIG. 5A during a second calibration step.

At block 310 the pre-pulse length $T_{pp}$ may be adjusted until the voltage reaches the flat top output voltage $V_{out}$, or a voltage that is substantially close to $V_{out}$. This adjustment may ensure that the amount of energy injected into the output while the switch is closed is enough to charge $C_{stray}$ to $V_{charge}$. $V_{out}$ and $V_{charge}$ may be substantially equal except for circuit losses such as, for example, losses in a switch or the output. An example of this input pulse is shown in FIG. 5A and the resulting output pulse is shown in FIG. 5B. For example, if the output voltage is less than $V_{out}$, the pre-pulse length $T_{pp}$ may be lengthened. As another example, if the output voltage is greater than $V_{out}$ the pre-pulse length $T_{pp}$ may be shortened. For example, the output may be shortened by 10%, 5%, or 1%.

Figure 6A:
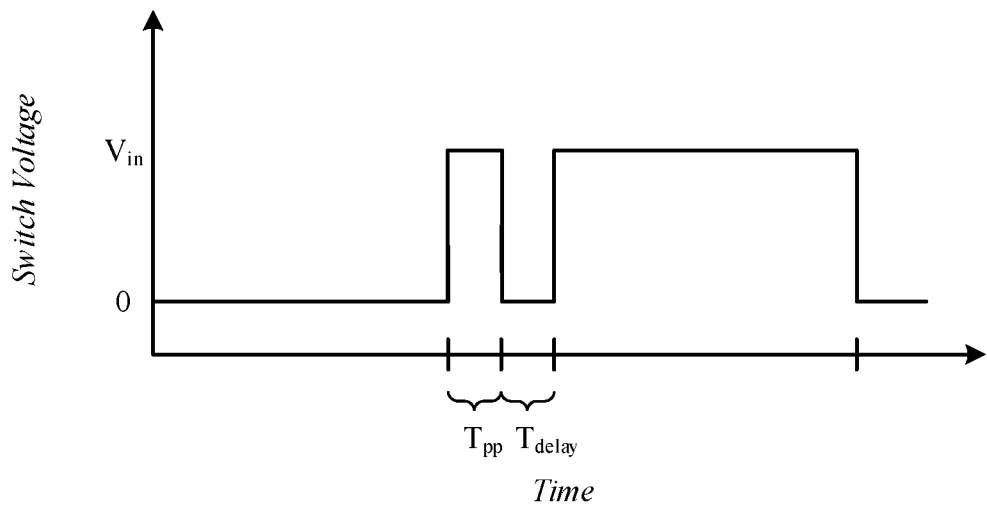
FIG. 6A illustrates a square pulse, switch voltage during a third calibration step.
Figure 6B:
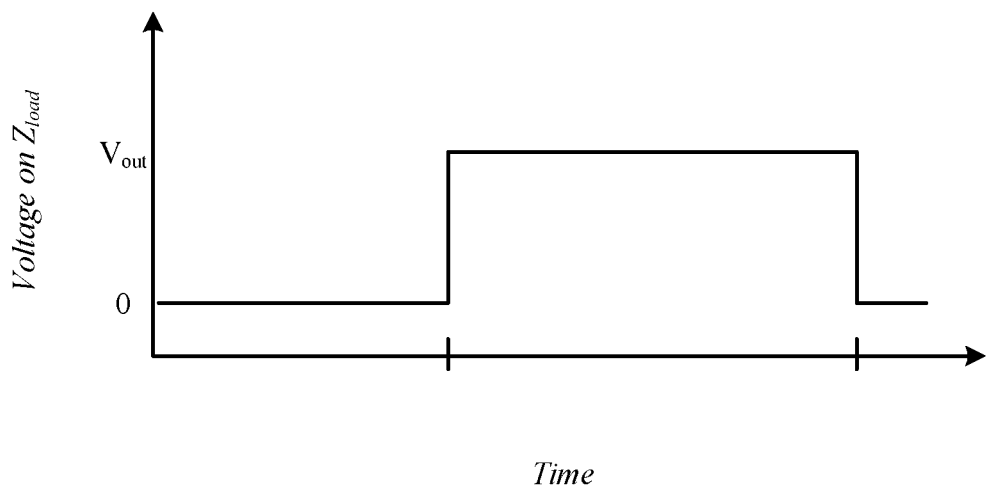
FIG. 6B illustrates a load voltage resulting from the square pulse, switch voltage shown in FIG. 6A during a third calibration step.

At block 315 the delay $T_{delay}$ may be adjusted until the output pulses merge as shown in FIG. 6A and FIG. 6B. The delay $T_{delay}$ may be adjusted using small incremental steps. The delay $T_{delay}$, for example, may be incremented to a new shorter delay $T_{delay}$, a new pre-pulse and pulse may be initiated by closing the switch 110, and a pre-pulse and pulse may be read from across the load 125. If the output pulses have not yet merged, the new shorter delay $T_{delay}$ may be incremented to a new even shorter delay $T_{delay}$, a new pre-pulse and pulse initiated by closing the switch 110, and the pre-pulse and pulse read from the load 125. This can be repeated until the pre-pulse and the pulse merge.

For example, the incremental adjustment may be some fraction of the initial delay $T_{delay}$. For example, if the initial delay $T_{delay}$ is 50 nanoseconds, the delay $T_{delay}$ may be incremented by the delay $T_{delay}$ divided by 100. In this example, the incremental delay may be 0.5 nanoseconds. As another example, if the initial delay $T_{delay}$ is 50 nanoseconds, then the delay $T_{delay}$ may be incremented by the delay $T_{delay}$ divided by 50. In this example, the incremental delay may be 1.0 nanoseconds.

In some embodiments, new pre-pulses and/or pulses may be generated, recorded, and/or analyzed before and/or after the various blocks of process 300.

Figure 7:
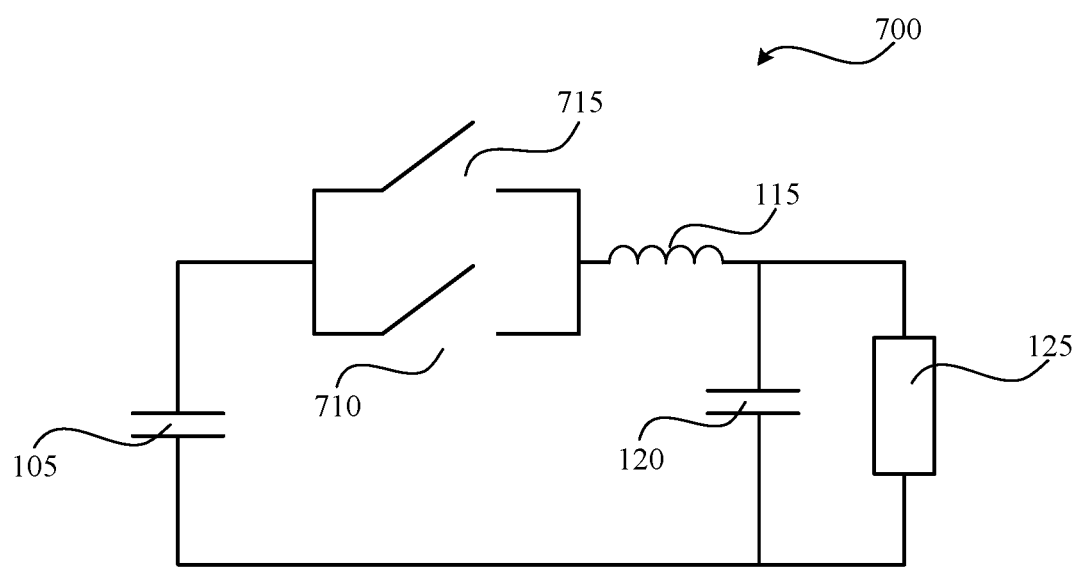
FIG. 7 is a block diagram of a load with two switches according to some embodiments.

FIG. 7 is a block diagram of a switching circuit 700 with two switches according to some embodiments. In this example, the switching circuit 700 may include a main switch 710 and a pre-pulse switch 715 rather than the switch 110. The pre-pulse switch 715 may be used to create the pre-pulse and/or to inject energy to charge the stray inductance 115. The main switch 710 may be open while the pre-pulse switch 715 is closed for the period of time $t_{pp}$. After the pre-pulse switch 715 has opened, the main switch 710 may be closed after delay $T_{delay}$. One of the reasons for pre-pulse switch 715 is to allow greater flexibility in the setting of $t_{pp}$ and $t_{delay}$. Not all switches that might be used in this invention allow for fast enough transitions that only a single switch can be used to set both the needed pre-pulse parameters as well as the main switch parameters.

Figure 8:
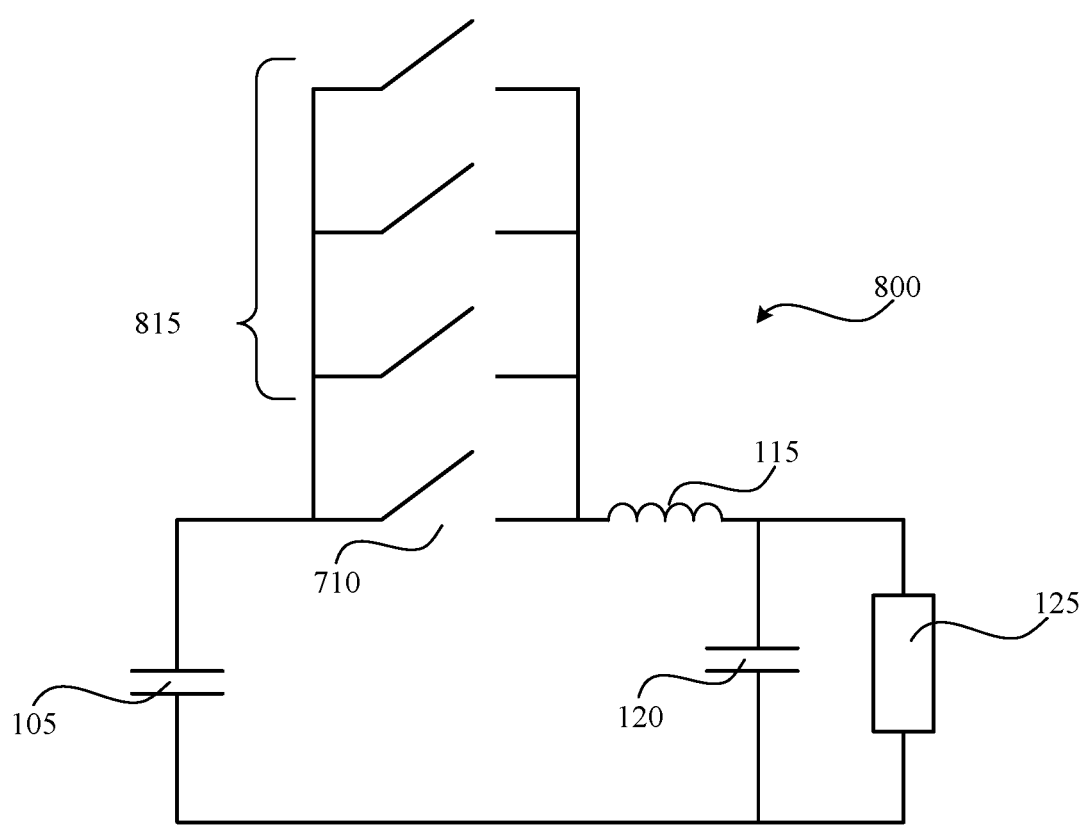
FIG. 8 is a block diagram of a load with a plurality of switches according to some embodiments.

FIG. 8 is a block diagram of a switching circuit 800 with a main switch 710 and a plurality of pre-pulse switches 815 according to some embodiments. In some embodiments, the main switch 810 may comprise one or more switching components. In some embodiments, the plurality of switches 815 may comprise one or more switching components. In some embodiments, the main switch 810 and the plurality of pre-pulse switches 815 may comprise one or more switching components.

Figure 9:
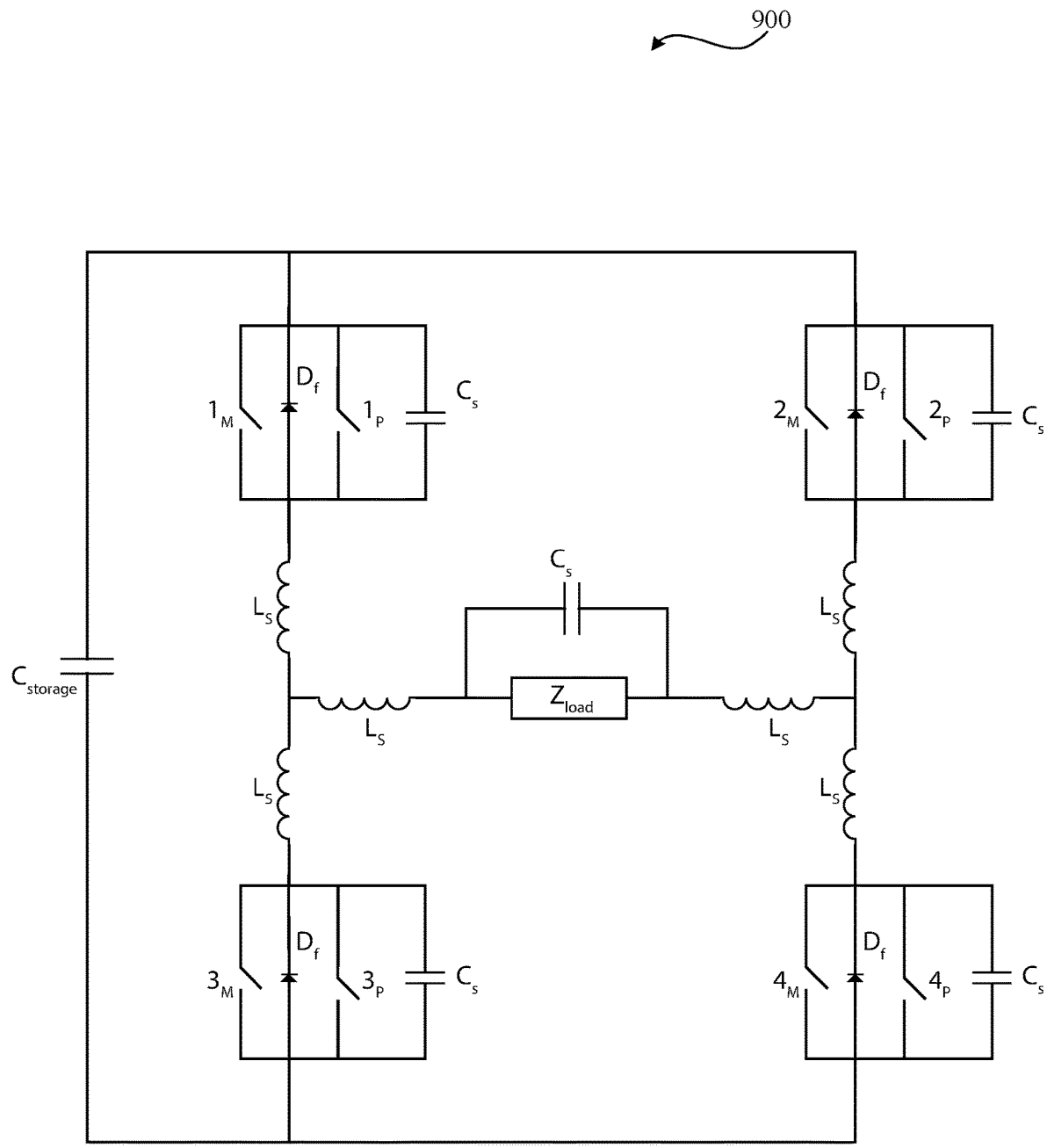
FIG. 9 is a block diagram of an H-bridge switching topology including pre-pulse switches according to some embodiments.

FIG. 9 is a block diagram of an H-bridge switching topology 900 including pre-pulse switches according to some embodiments. In order to drive a load with a bipolar square pulse (+V to −V rather than 0 to V), an H-bridge switching topology can be used as shown in FIG. 9. The pre-pulse switches are labeled in FIG. 9 with a subscript "P": 1p, 2p, 3p, and 4p. The main switches are labeled in FIG. 9 with a subscript "M": $1_M$, $2_M$, $3_M$, and $4_M$. The general functionality of the H-bridge is such that switches 1 and 4 closes at the same time, causing current to flow through the load in one direction. After these switches open, switches 2 and 3 close, and current flows the opposite direction through the load. In general, although this does not have to be the case, switches 1 and 4 receive the same gate signal, as do switches 2 and 3. In some embodiments, any time switch $1_M$ is closed, so is switch $4_M$. In some embodiments, any time switch $2_M$ is closed, so is switch $3_M$. In some embodiments, any time switch $1_p$ is closed, so is switch $4_p$. In some embodiments, any time switch $2_p$ is closed, so is switch $3_p$.

The H-bridge also has values for stray inductance, $L_s$, and stray capacitance, $C_s$, labeled in FIG. 9 as $L_s$, and $C_s$, respectively. Each instance of $L_s$ and $C_s$ may have a different value. The specific values of all the stray inductance, $L_s$, and stray capacitance, $C_s$, in some embodiments, may not of particular importance, since the pre-pulse settings allow for a wide variety of stray inductance, $L_s$, and stray capacitance, $C_s$, to be compensated for. In addition, stray inductance, $L_s$, and stray capacitance, $C_s$, may appear in many additional places in the circuit. Although the behavior may be more complicated than the switching circuit in FIG. 9, the result may be similar. As either switch pair closes, the $L_s$ of the current path through the load causes an overshoot in the voltage of $C_s$, and thus a voltage spike on $Z_{load}$. Some embodiments can be used to mitigate these voltage spikes in the same way as in the simple switching topologies described above. Note that the placement of $C_s$ and $L_s$ in FIG. 9 is an example of stray components at some relevant locations, but is not meant to be an exhaustive description of all stray components that may be found within a switching circuit. In some embodiments, a freewheeling diode $D_f$ can be placed as shown in parallel between each group of main and pre-pulse switches.

Figure 10A:
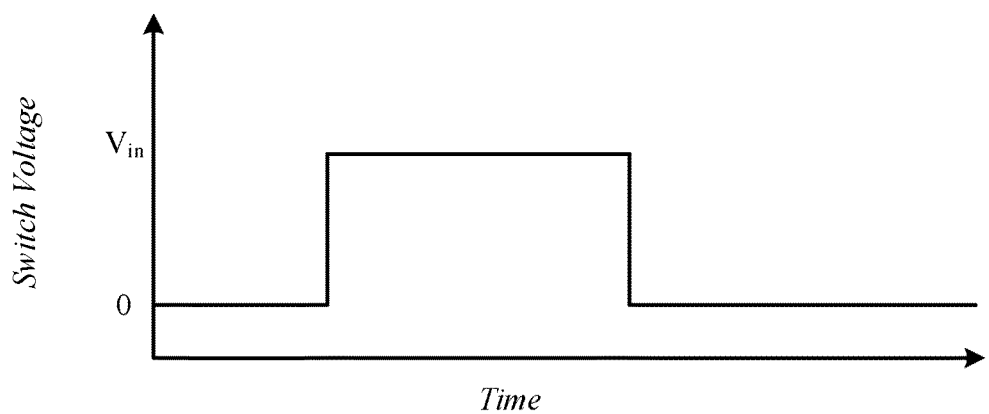
FIG. 10A illustrates a square pulse, switch voltage across two switches in FIG. 9.
Figure 10B:
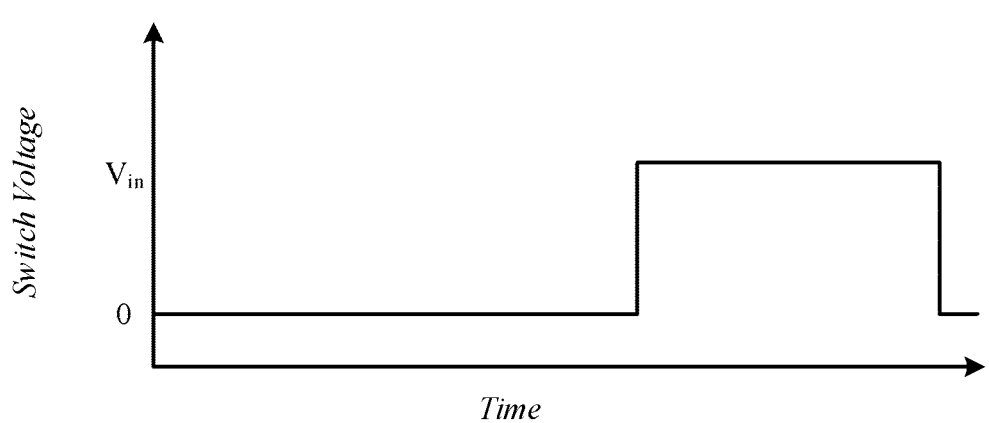
FIG. 10B illustrate a square pulse, switch voltage across two different switches in FIG. 9.
Figure 10C:
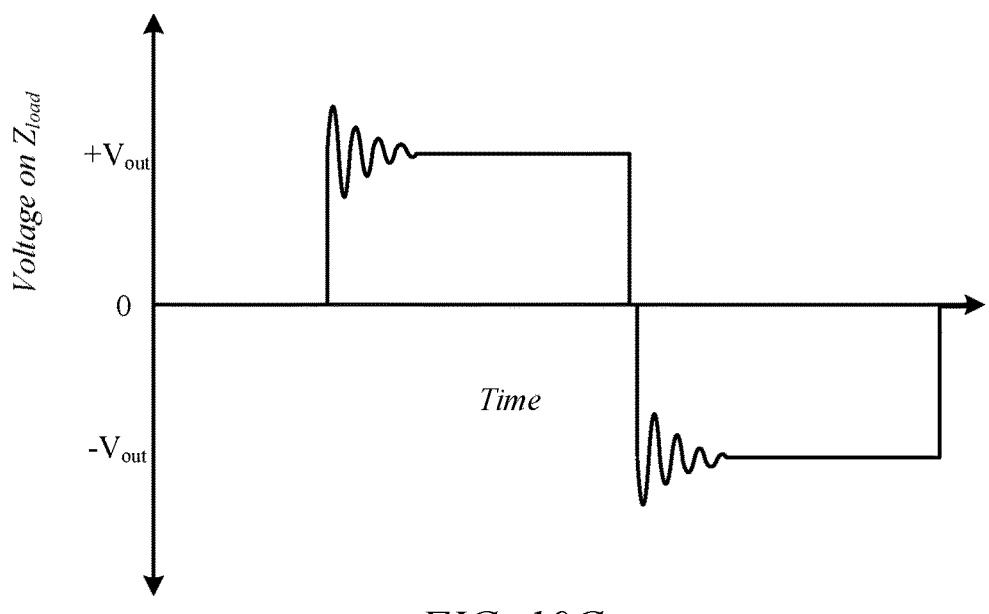
FIG. 10C illustrates a voltage across a load from the square pulses shown in FIG. 10A and FIG. 10B.

FIG. 10A and FIG. 10B illustrates a square pulse at switches $1_M$ and $4_M$ and $2_M$ and $3_M$ respectively. The closing of switches $1_M$ and $4_M$ creates a positive square pulse on $Z_{load}$ as shown as the first pulse in FIG. 10C. The closing of switches $2_M$ and $3_M$ create a negative square pulse on $Z_{load}$ as shown in the second pulse in FIG. 10C. In this example, the pre-pulse switches ($1_P$, $2_P$, $3_P$, $4_p$) are not used. The main switches ($1_m$, $2_M$, $3_M$, $4_M$) form an H-Bridge without the pre-pulse switches. In this case, the output square pulse profile will look as it does in FIG. 10C. As each switch pair closes, the stray inductance, $L_s$, in series with the closed switches and the load will overcharge the stray capacitor $C_s$, creating the voltage overshoots and ringing visible on the $Z_{load}$.

Figure 11A:
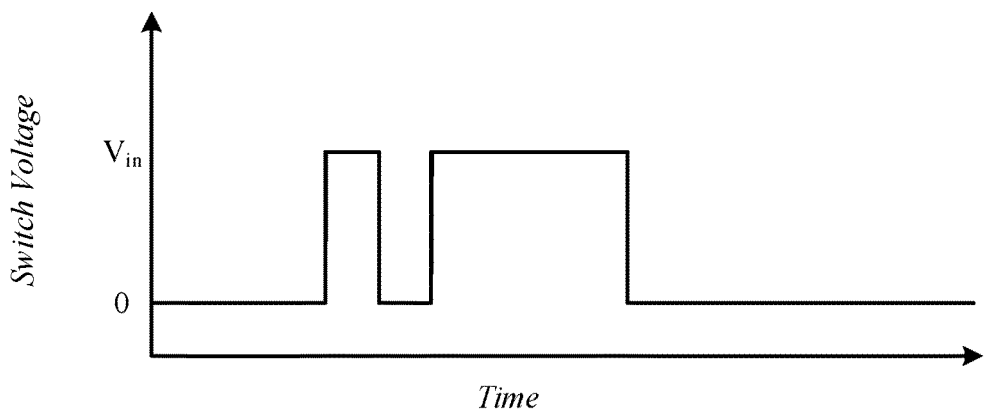
FIG. 11A illustrates a square pulse, switch voltage across two switches in FIG. 9.

FIG. 11A illustrates a square pre-pulse and square pulse at switches $1_P$ and $4_P$ (pre-pulses) and $1_M$ and $4_M$. The closing of switches $1_P$ and $4_P$ creates a pre-pulse and closing of the switches $1_M$ and $4_M$ creates a positive square pulse on $Z_{load}$ as shown in the first square wave of FIG. 11C.

Figure 11B:
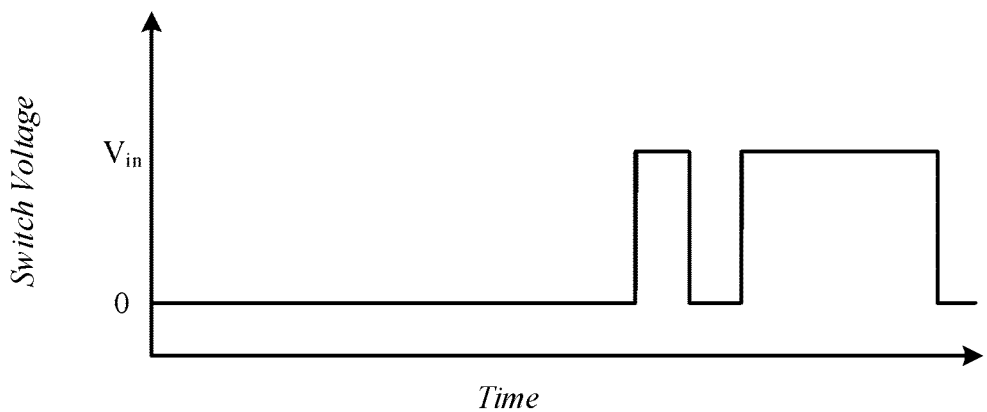
FIG. 11B illustrate a square pulse, switch voltage across two different switches in FIG. 9.
Figure 11C:
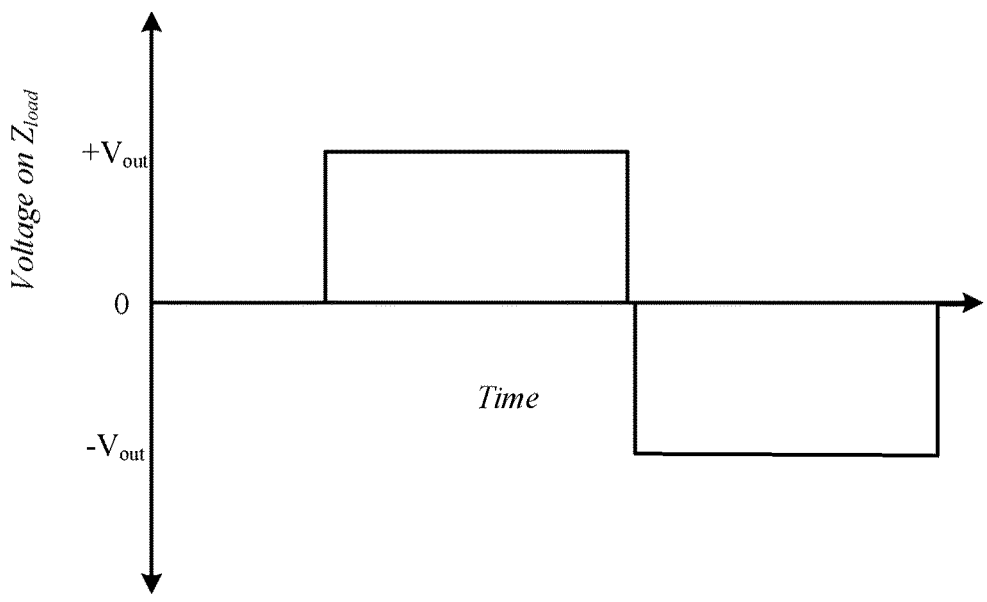
FIG. 11C illustrates a voltage across a load from the square pulses shown in FIG. 11A and FIG. 11B.
Figure 12:
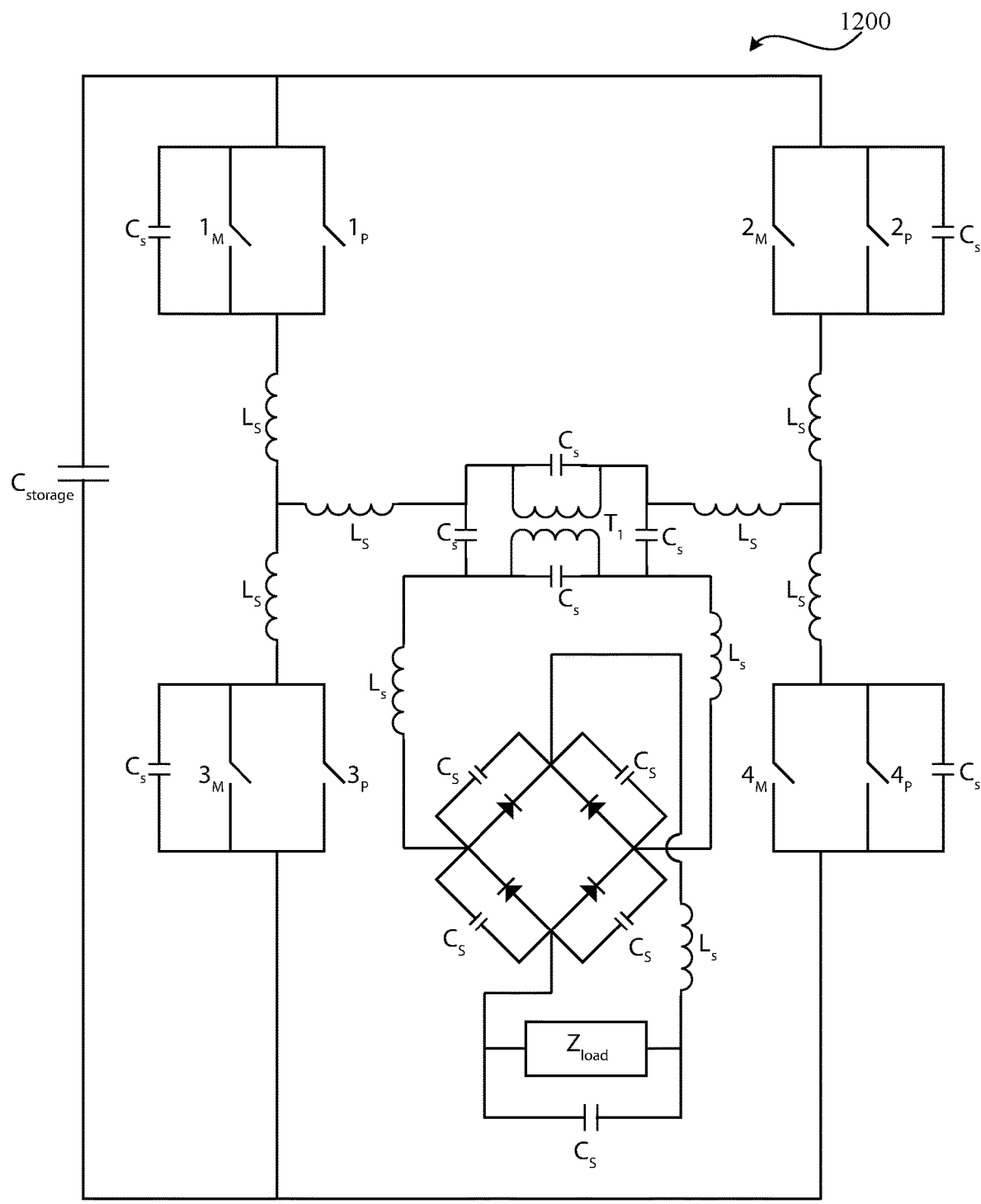
FIG. 12 is a block diagram of an H-bridge switching topology including pre-pulse switches and a rectified output according to some embodiments.

FIG. 11B illustrates a square pre-pulse and square pulse at switches $2_P$ and $3_P$ (pre-pulses) and $2_M$ and $3_M$. The closing of switches $2_P$ and $3_P$ creates a pre-pulse and closing of the switches $2_M$ and $3_M$ create a negative square pulse on $Z_{load}$ as shown as the second pulse in FIG. 11C. When the pre-pulse switches are enabled, the input pulses just before the $N_M$ (N=1, 2, 3, or 4, in this configuration, but could be any integer depending on the number of switches) switches close, the $N_p$ switches close briefly for the short pre-pulse duration $T_{pp}$ to charge the stray capacitance, $C_s$, and/or the stray inductance, Ls. These then reopen and all switches are open for $T_{delay}$. After $T_{delay}$, the pair of $N_M$ Main switches closes, applying a square pulse to the $Z_{load}$ and the already-charged stray capacitance, $C_s$, and/or the stray inductance, Ls. This method, when calibrated, for example, with process 300, may yield the output waveform on $Z_{load}$. as shown in FIG. 11C FIG. 12 is a block diagram of an H-bridge switching circuit 1200 including pre-pulse switches and a rectified output according to some embodiments. While the rest of the H-Bridge, including the setup of pre-pulse switches, is the same as in FIG. 9 a full-bridge rectifier may be placed between the switches and the load. This design ensures that every pulse applied to the load is polarized in the same direction, rather than bipolar. The diodes have an associated parallel $C_s$, inherent to standard diodes, which must be addressed in addition to the $C_s$ across the load. Note that as before, the placement of stray capacitance, $C_s$, and stray inductance, $L_s$, in the H-bridge switching circuit 1200 is an example of stray components at some relevant locations, but is not meant to be an exhaustive description of all stray components that the pre-pulse method attempts to address. For example, $C_s$ often appears across all of the switches, and all of the diodes used in the circuit, including all of the main switches, and all of the pre-pulse switches. In addition, numerous other elements may exist in the circuit, that contain $C_s$ and $L_s$, including various snubber elements that appear across the switches, and transformers that separate the load from the switches.

Each instance of $L_s$ and $C_s$ shown in FIG. 12 may have a different value. The specific values of all the stray inductance, $L_s$, and stray capacitance, $C_s$, in some embodiments, may not of particular importance, since the pre-pulse settings allow for a wide variety of stray inductance, $L_s$, and stray capacitance, $C_s$, to be compensated for. In addition, stray inductance, $L_s$, and stray capacitance, $C_s$, may appear in many additional places in the circuit.

Figure 13A:
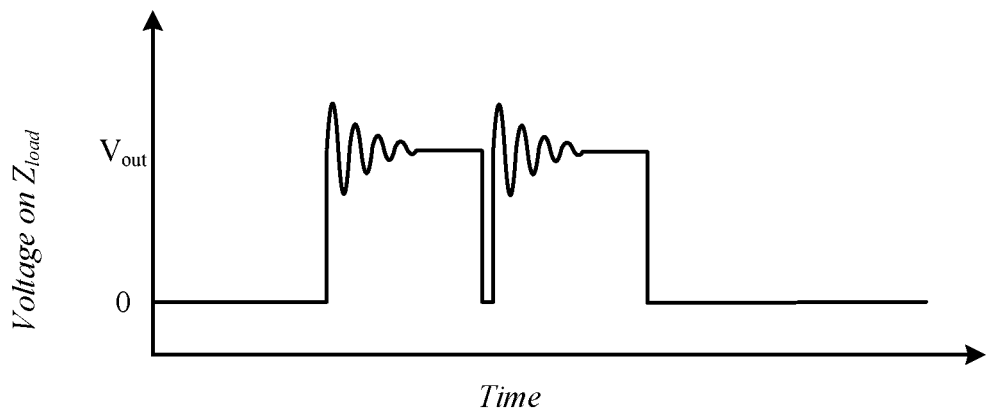
FIG. 13A illustrates a load voltage.

If the pre-pulse method is calibrated in the standard H-Bridge configuration such as, for example, in a manner as described in conjunction with process 300, and the rectifier is inserted afterward, the stray capacitance of the diodes may alter the output conditions enough to require recalibration. If this is the case, the output waveform across $Z_{load}$ may appear as shown in FIG. 13A. Calibration such as, for example, using process 300, may, for example, allow the pre-pulse switches to close for a different $T_{pp}$ that injects enough energy to charge the new value for $C_s$. This will result in the voltage waveform on $Z_{load}$ as seen in FIG. 13B.

In some embodiments, in the rectified output may include Transformer $T_1$ as shown in FIG. 12. The Transformer $T_1$ (e.g., a high voltage transformer) is disposed, prior to the rectifier. This could, for example, create a higher-voltage output pulse, and may result in additional $C_s$ and $L_s$ that may require additional calibration of the pre-pulse $T_{pp}$ and $T_{delay}$ parameters to achieve the output waveforms as in FIG. 13B.

Figure 13B:
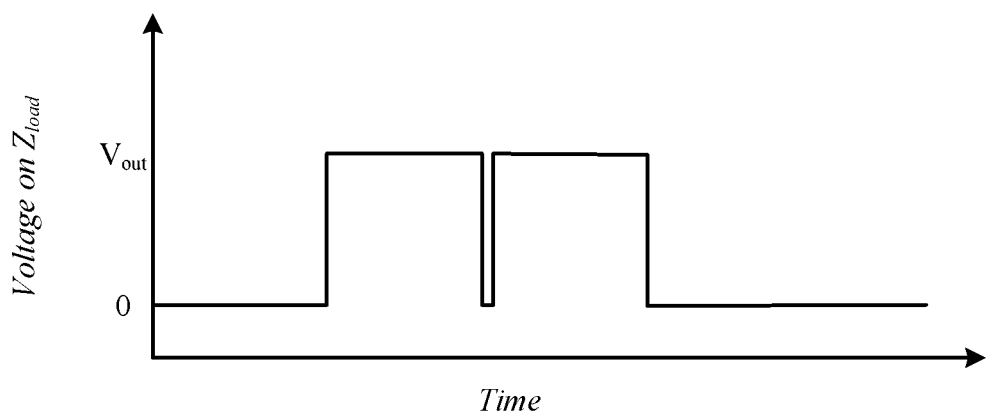
FIG. 13B illustrates a square pulse, switch voltage.
Figure 14A:
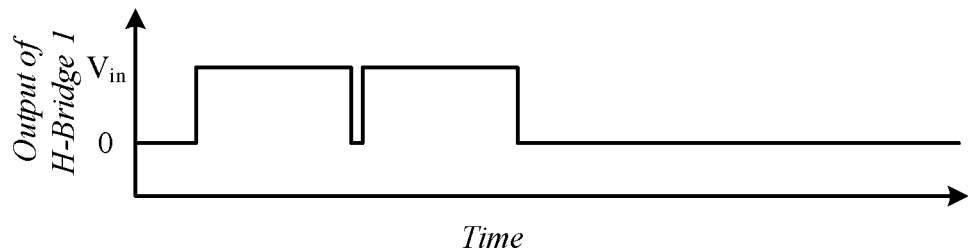
FIG. 14A illustrates a first square pulse, switch voltage at the load.

The rectified waveforms in FIG. 13B, and reproduced as FIG. 14A, exhibit a common issue in rectified square pulses from an H-Bridge: the "trenching" between output pulses. When attempting to create an arbitrarily long, single-sided output pulse by rectifying consecutive H-Bridge bipolar pulses, the trenching can be seen as a dip in the output waveform (after the rectifier) that occurs between switching cycles. This may possibly result from the time period between switching cycles, when all switches are open. While it is possible to reduce this time period to be on the order of 1 ns, 10 ns, 100 ns, 1000 ns, the risk is the increased chance of "shoot-through", which is the condition in which, either due to a drive circuitry jitter or something else, all four switches are closed at once. This may possibly create a short, low-impedance path through switches 1 and 3 (and/or switches 2 and 4) through which $C_{storage}$ may quickly discharge. The resulting high currents may, for example, damage traces, wires, or other delicate drive circuitry components nearby. As a result, this trench may possibly be a feature of the H-Bridge rectified output.

Figure 14B:
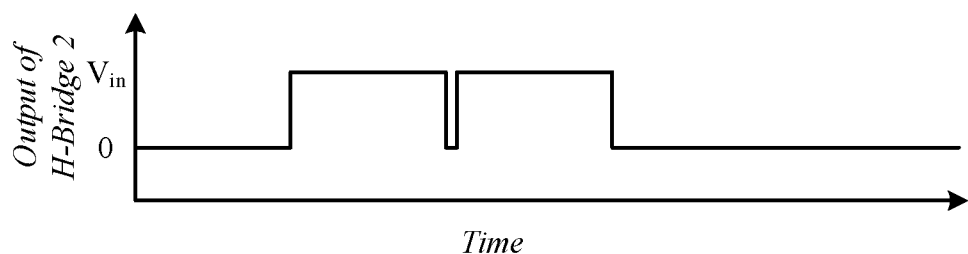
FIG. 14B illustrates a second square pulse, switch voltage at the load.

In some embodiments, this trenching problem can be solved by combining the output of two H-Bridge units phased relative to each other. The setup can be visualized as similar to switching circuit 1200 shown in FIG. 12 with a second rectified H-Bridge in parallel with the one shown as switching circuit 1200, and/or connected to the load. The phasing relationship between these two H-Bridges can be seen in FIG. 14A and FIG. 14B. The two pulses may be delayed/phased enough relative to each other such that the trenches of one H-Bridge output are present only when the other waveform has a flat-top. The phasing shown is not the only way to phase the H-Bridges. Although the duty-cycle in these plots is approaching 100%, a similar output could be achieved by duty cycles closer to 50%.

Figure 14C:
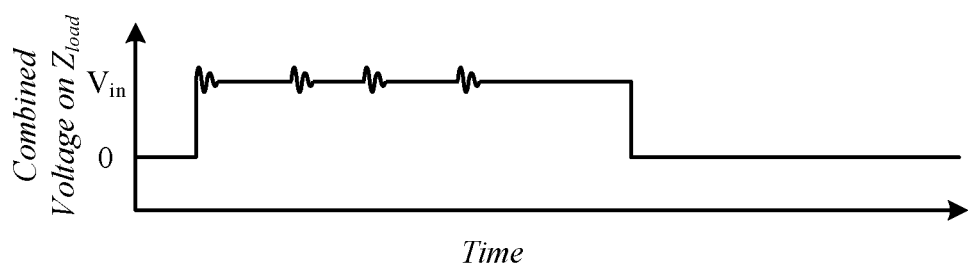
FIG. 14C illustrates a load voltage.
Figure 14D:
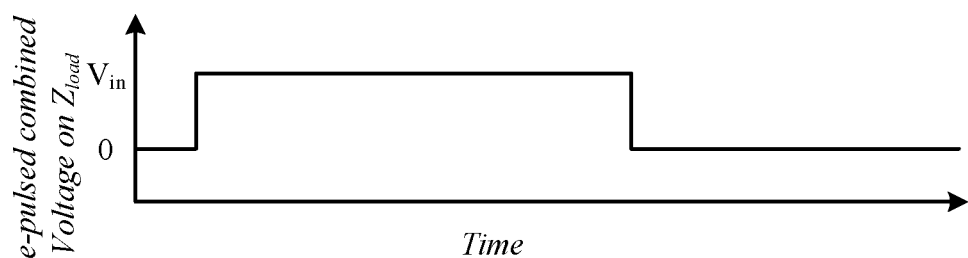
FIG. 14D illustrates a load voltage.

Upon applying the two phased waveforms in parallel to $Z_{load}$, the combined output in FIG. 14C will appear across the load. When the switches transition, there will be additional ringing atop the waveform. This is due to the fact that when one H-Bridge switches, it is switching "into" the output of the other H-Bridge. This may manifest itself, for example, as a change in the stray capacitance seen by the switching H-Bridge. Upon recalibration of the pre-pulse parameters, the waveform shown in FIG. 14D may appear on $Z_{load}$. Proper pre-pulse operation greatly reduces the ringing seen on the waveform. Ringing should be reduced by a factor of two, if not much more. Similarly, the residual depth of any remaining trench like feature should be reduced by a factor of two, if not more.

This configuration may be operated with a transformer (e.g., a pulsed transformer), with only the pre-pulse calibration parameters needing to change.

In some embodiments, the calibration of the pre-pulse parameters may be load dependent. This may be because of the critical condition that the current through $L_s$ be $V_{charge}/Z_{load}$ when the main switch closes. If the pre-pulse timing is calibrated with some load $Z_{load}$, this is akin to stating that the current through $L_s$ when the main switch closes, given the current calibration, is $V_{charge}/Z_{load}$. However, if the output impedance is changed to $Z_2$ where $Z_2 \neq Z_{load}$, then the parameters $T_{pp}$ and $T_{delay}$ may need to be recalibrated such that the current through the stray inductance is now $V_{charge}/Z_2$ when the main switch closes. This means, for example, that without recalibration, a change in load impedance, either due to a physical change by the operator or in the case of a dynamic load, will result in a waveform that exhibits ringing/overshoot behavior. In some embodiments, the current flowing through stray inductance $L_s$ may be substantially the same as the currently flowing through load $Z_{load}$. For example, the current flowing through stray inductance $L_s$ may be within 80%-120% of the current flowing through the load $Z_{load}$. Alternatively or additionally, the current flowing through stray inductance $L_s$ may be within 20%-200% of the current flowing through the load $Z_{load}$.

The gate drive circuitry of any supply using the pre-pulse method may be driven by an FPGA or equivalent microcontroller such as, for example, the computational system 1500. Calibration, for example, may occur in real-time. Which may, for example, allow for real-time adjusting of the pre-pulse calibration parameters to achieve square pulse pulses with greatly reduced ringing on a dynamic load. The output current and voltage can be measured, and this information allows the FPGA to make an accurate, pulse-by-pulse estimate of the load impedance. Through either a table of pre-programed values or an equation or set of equations and conditions, the FPGA can alter the parameters of $T_{pp}$ and $T_{delay}$ to remove ringing from the waveform on the load as the load changes, without having to go through the three-step calibration process.

Along with on-the-fly and/or real-time adjustment of the pre-pulse parameters, the integration of FPGA control allows for manipulation of other output characteristics via front-panel control. A user would be able to adjust output parameters such as pulse width, duty cycle, frequency, voltage, etc., either directly or indirectly through the setting of various front panel parameters. In addition, the FPGA would be able to monitor for fault conditions (over-current due to load shorting, etc.) and shut down the supply safely to avoid damage to the supply or load The computational system 1500 (or processing unit) illustrated in FIG. 15 can be used to perform and/or control operation of any of the embodiments described herein. For example, the computational system 1500 can be used alone or in conjunction with other components. As another example, the computational system 1500 can be used to perform any calculation, solve any equation, perform any identification, and/or make any determination described here. The computation system 1500 may include all or some of the components shown in FIG. 15. In some embodiments, the computation system 1500 may be programmed on an FPGA.

The computational system 1500 may include any or all of the hardware elements shown in the figure and described herein. The computational system 1500 may include hardware elements that can be electrically coupled via a bus 1505 (or may otherwise be in communication, as appropriate). The hardware elements can include one or more processors 1510, including, without limitation, one or more general-purpose processors and/or one or more special-purpose processors (such as digital signal processing chips, graphics acceleration chips, and/or the like); one or more input devices 1515, which can include, without limitation, a mouse, a keyboard, and/or the like; and one or more output devices 1520, which can include, without limitation, a display device, a printer, and/or the like. In some embodiments, the output device 1520 may include, for example, switch 110.

In some embodiments, an input device 1515 may include a voltage meter that can is configured to read the output voltage across a load (e.g., load 125). The input device 1515 may input the voltage wave forms shown in FIG. 2B, FIG. 4B, FIG. 5B, and/or FIG. 6B. Numerous additional voltage and or current waveforms derived from the circuit may be input into the computer, as may many other circuit parameters such as component temperatures, ambient temperature, etc.

The computational system 1500 may further include (and/or be in communication with) one or more storage devices 1525, which can include, without limitation, local and/or network-accessible storage and/or can include, without limitation, a disk drive, a drive array, an optical storage device, a solid-state storage device, such as random-access memory ("RAM") and/or read-only memory ("ROM"), which can be programmable, flash-updateable, and/or the like. The computational system 1500 might also include a communications subsystem 1530, which can include, without limitation, a modem, a network card (wireless or wired), an infrared communication device, a wireless communication device, and/or chipset (such as a Bluetooth® device, an 802.6 device, a Wi-Fi device, a WiMAX device, cellular communication facilities, etc.), and/or the like. The communications subsystem 1530 may permit data to be exchanged with a network (such as the network described below, to name one example) and/or any other devices described herein. In many embodiments, the computational system 1500 will further include a working memory 1535, which can include a RAM or ROM device, as described above.

The computational system 1500 also can include software elements, shown as being currently located within the working memory 1535, including an operating system 1540 and/or other code, such as one or more application programs 1545, which may include computer programs of the invention, and/or may be designed to implement methods of the invention and/or configure systems of the invention, as described herein. For example, one or more procedures described with respect to the method(s) discussed above might be implemented as code and/or instructions executable by a computer (and/or a processor within a computer). A set of these instructions and/or codes might be stored on a computer-readable storage medium, such as the storage device(s) 1525 described above.

In some cases, the storage medium might be incorporated within the computational system 1500 or in communication with the computational system 1500. In other embodiments, the storage medium might be separate from the computational system 1500 (e.g., a removable medium, such as a compact disc, etc.), and/or provided in an installation package, such that the storage medium can be used to program a general-purpose computer with the instructions/code stored thereon. These instructions might take the form of executable code, which is executable by the computational system 1500 and/or might take the form of source and/or installable code, which, upon compilation and/or installation on the computational system 1500 (e.g., using any of a variety of generally available compilers, installation programs, compression/decompression utilities, etc.), then takes the form of executable code.

The term "substantially" means within 5%, 10%, or 20% of the value referred to or within manufacturing tolerances.

Various embodiments are disclosed. The various embodiments may be partially or completely combined to produce other embodiments.

Numerous specific details are set forth herein to provide a thorough understanding of the claimed subject matter. However, those skilled in the art will understand that the claimed subject matter may be practiced without these specific details. In other instances, methods, apparatuses or systems that would be known by one of ordinary skill have not been described in detail so as not to obscure claimed subject matter.

Some portions are presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm is a self-consistent sequence of operations or similar processing leading to a desired result. In this context, operations or processing involves physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

The system or systems discussed herein are not limited to any particular hardware architecture or configuration. A computing device can include any suitable arrangement of components that provides a result conditioned on one or more inputs. Suitable computing devices include multipurpose microprocessor-based computer systems accessing stored software that programs or configures the computing system from a general purpose computing apparatus to a specialized computing apparatus implementing one or more embodiments of the present subject matter. Any suitable programming, scripting, or other type of language or combinations of languages may be used to implement the teachings contained herein in software to be used in programming or configuring a computing device.

Embodiments of the methods disclosed herein may be performed in the operation of such computing devices. The order of the blocks presented in the examples above can be varied—for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for purposes of example rather than limitation, and does not preclude inclusion of such modifications, variations and/or additions to the present subject matter as would be readily apparent to one of ordinary skill in the art.

That which is claimed:

1. A pre-pulse switching calibration method comprising:
   providing a pre-pulse with a pulse width $T_{pp}$ to a load by closing a pre-pulse switch and opening the pre-pulse switch;
   providing a main pulse to the load after a delay $T_{delay}$ by closing a main switch and opening the main switch, the main pulse has an output voltage $V_{out}$;
   adjusting the pulse width of the pre-pulse $T_{pp}$; and
   adjusting the delay $T_{delay}$ until the pre-pulse and the main pulse merge into a single pulse at the load.

2. The method according to claim 1, wherein the pulse width $T_{pp}$ is less than 1,000 ns.

3. The method according to claim 1, wherein the delay $T_{delay}$ is less than 1,000 ns.

4. The method according to claim 1, wherein adjusting the delay $T_{delay}$ until the pre-pulse and the main pulse merge into a single pulse at the load further comprising incrementing the delay $T_{delay}$ by a factor of less than $T_{delay}/10$.

5. The method according to claim 1, wherein adjusting the pulse width of the pre-pulse $T_{pp}$, further comprises:
   determining that the voltage at the load from the pre-pulse is less than the output voltage; and
   increasing the pulse width of the pre-pulse $T_{pp}$.

6. The method according to claim 1, wherein adjusting the pulse width of the pre-pulse $T_{pp}$, further comprises:
   determining that the voltage at the load has a dip due to $T_{delay}$ being too long; and
   decreasing the width of $T_{delay}$.

7. The method according to claim 1, wherein the delay $T_{delay}$ is less than the pulse width of $T_{pp}$.

8. The method according to claim 1, wherein the output voltage $V_{out}$ is greater than 100 V.

9. The method according to claim 1, wherein the pre-pulse has a rise time less than about 500 ns.

10. A pre-pulse switching system comprising:
    a power source configured to provide a voltage greater than 100 V;
    a pre-pulse switch coupled with the power source and configured to provide a pre-pulse having a pulse width of $T_{pp}$; and
    a main switch coupled with the power source and configured to provide a main pulse;
    wherein the pre-pulse is provided to a load by closing the pre-pulse switch while the main switch is open;
    wherein the main pulse is provided to the load by closing the main switch after a delay $T_{delay}$ after the pre-pulse switch has been opened;
    wherein the delay $T_{delay}$ is adjusted such that at the load the pre-pulse and the main pulse combine to a form a single pulse with negligible ringing.

11. The pre-pulse switching system according to claim 10, wherein the pre-pulse has a rise time less than 500 ns.

12. The pre-pulse switching system according to claim 10, further comprising a rectified output.

13. The pre-pulse switching system according to claim 10, further comprising an H-bridge switching topology.

14. The pre-pulse switching system according to claim 10, wherein the stray inductance of the pre-pulse switching system is less than about 1000 nH.

15. The pre-pulse switching system according to claim 10, wherein the stray capacitance of the pre-pulse switching system is less than about 1000 nF.

16. The pre-pulse switching system according to claim 10, wherein either or both the main switch and the pre-pulse switch comprise a solid-state switch.

17. A switching system comprising:
   a high voltage power supply;
   an output;
   a plurality of pre-pulse switches coupled with the high voltage power supply, each of the plurality of pre-pulses are configured to provide a pre-pulse to the output; and
   a plurality of main switches coupled with the power supply, each of the plurality of main switches are configured to provide a main pulse to the output with a voltage greater than 100 V, wherein there is a delay $T_{delay}$ between each end of a respective pre-pulse and each start of a respective main pulse, wherein the delay $T_{delay}$ is adjusted to produce an output pulse that comprises a single output pulse from the combination of the pre-pulse and the main pulse switches with a pulse length greater than 10 ns.

18. The switching system according to claim 17, wherein the output pulse has negligible ringing.

19. The switching system according to claim 17, wherein each of the main pulses are provided after a delay from the plurality of pre-pulse switches providing the plurality of pre-pulses.

20. The switching system according to claim 17, wherein the plurality of pre-pulse switches and the plurality of main switches are arranged in an H-bridge topology.

21. The switching system according to claim 17, wherein the pre-pulse has a rise time less than 500 ns.

22. The switching system according to claim 17, further comprising a transformer coupled output.

* * * * *